United States Patent [19]
Sittig

[11] Patent Number: 5,954,122
[45] Date of Patent: Sep. 21, 1999

[54] WEDGE CLAMPING DEVICE FOR A FLAT PLATE/PRINTED CIRCUIT BOARD

[75] Inventor: Michael A. Sittig, San Diego, Calif.

[73] Assignee: Eastman Kodak Company, Rochester, N.Y.

[21] Appl. No.: 09/112,556

[22] Filed: Jul. 9, 1998

[51] Int. Cl.⁶ .................................................... H05K 7/20
[52] U.S. Cl. ................. 165/80.2; 403/374.3; 403/409.1; 361/721
[58] Field of Search ......................... 165/80.2; 403/374.3, 403/409.1; 361/721

[56] References Cited

U.S. PATENT DOCUMENTS

| | | | |
|---|---|---|---|
| 4,751,963 | 6/1988 | Bui et al. ................................ | 165/80.2 |
| 4,779,674 | 10/1988 | McNulty ................................. | 165/80.2 |
| 4,819,713 | 4/1989 | Weisman ................................ | 165/80.2 |
| 4,849,858 | 7/1989 | Grapes et al. ....................... | 165/80.2 X |
| 5,036,428 | 7/1991 | Brownhill et al. ....................... | 361/721 |
| 5,779,388 | 7/1998 | Yamamoto ........................... | 403/405.1 |

Primary Examiner—Allen J. Flanigan
Attorney, Agent, or Firm—William F. Noval

[57] ABSTRACT

A clamping device comprising: a mounting member having at least one slot, the slot having a flat reference surface and an opposed camming surface spaced therefrom; a clamp located in the at least one slot, the clamp having a flat surface parallel to but spaced from the flat surface of the slot for receiving an edge of a flat plate and having a camming surface which contacts the camming surface of the slot; an off-center spring located between the clamp and the member; and a tensioned screw for mounting the clamp to the mounting member.

3 Claims, 2 Drawing Sheets

WEDGE CLAMPING DEVICE FOR A FLAT PLATE/PRINTED CIRCUIT BOARD

FIELD OF THE INVENTION

This invention relates in general to flat plate securing devices and more particularly relates to a device to secure flat plates (such as printed circuit boards) in place with a high degree of accuracy and little relative motion.

BACKGROUND OF THE INVENTION

In current high technology electronic equipment, individual printed circuit boards (PCB) are commonly mounted in a housing by a variety of mounting devices (see: U.S. Pat. No. 5,499,163, issued Mar. 12, 1996, inventors Sonntage et al.; U.S. Pat. No. 4,730,819, issued Mar. 15, 1988, inventors Hirschhorn et al.; U.S. Pat. No. 5,472,353, issued Dec. 5, 1995, inventors Hristake et al.; U.S. Pat. No. 4,459,639, issued Jul. 10, 1984, inventors Heil et al.; U.S. Pat. No. 4,794,676, issued Jan. 3, 1989, inventor Rose; U.S. Pat. No. 5,016,141, issued May 14, 1991, inventors Lorig et al.; and U.S. Pat. No. 5,290,122, issued Mar. 1, 1994, inventor Hulme).

There is a need that such PCB mounting devices 1) secure the PCB in place with a high degree of accuracy and with little relative motion, 2) secure the PCB during high shock and vibration conditions; 3) apply mounting forces which are tightly controlled and which are visibly inspectable without disturbing the components being held; 4) allow easy insertion of the PCB; 5) keep a constant contact with a reference plane that can be used as a PCB cooling path. The configurations disclosed in the above-referenced patents do not fulfill these needs.

SUMMARY OF THE INVENTION

According to the present invention, there is provided a solution to the problems of the prior art.

According to a feature of the present invention, there is provided a clamping device comprising: a mounting member having at least one slot, the slot having a flat reference surface and an opposed camming surface spaced therefrom; a clamp located in the at least one slot, the clamp having a flat surface parallel to but spaced from the flat surface of the slot for receiving an edge of a flat plate and having a camming surface which contacts the camming surface of the slot; an offcenter spring located between the clamp and the member; and a tensioned screw for mounting the clamp to the mounting member.

ADVANTAGEOUS EFFECT OF THE INVENTION

The invention has the following advantages.

1. The flat plate/PCB is secured in place with a high degree of accuracy and with little relative motion.
2. The flat plate/PCB can be secured during high shock and vibration conditions.
3. Mounting forces are applied that are tightly controlled and that can be visibly inspected without disturbing the components being held.
4. The flat plate/PCB can be easily inserted.
5. The PCB is kept in constant thermal contact with a reference plane that can be used as a PCB cooling path.

DETAILED DESCRIPTION OF THE INVENTION

In general, the present invention is useful in applications where one or more flat plates, such as printed circuit boards (PCBs), are mounted in spaced, parallel relationship. Thus, PCBs are typically mounted in the chassis (card rack) of electronic equipment by mounting the PCBs in spaced, parallel alignment in slots on the chassis. In many applications, the PCBs are mounted under conditions of severe shock and vibration so that it is necessary to mount the PCBs securely without damage to them. It is also often desirable to provide a thermal path from the mounted PCB to the chassis so that heat generated by the PCB circuits can be carried away.

Figure 1:
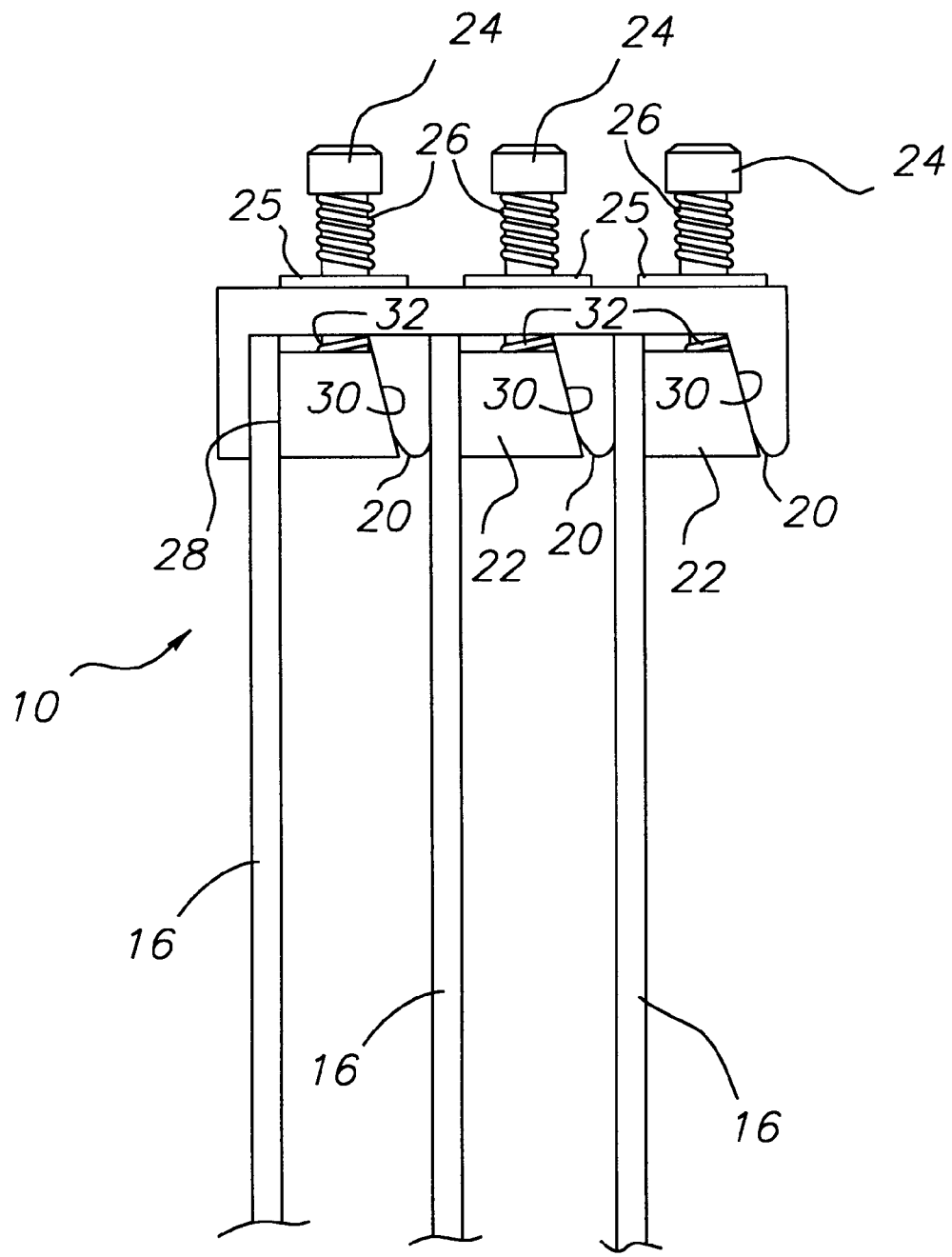
FIG. 1 is an elevational diagrammatic view of an embodiment of the present invention.
Figure 2:
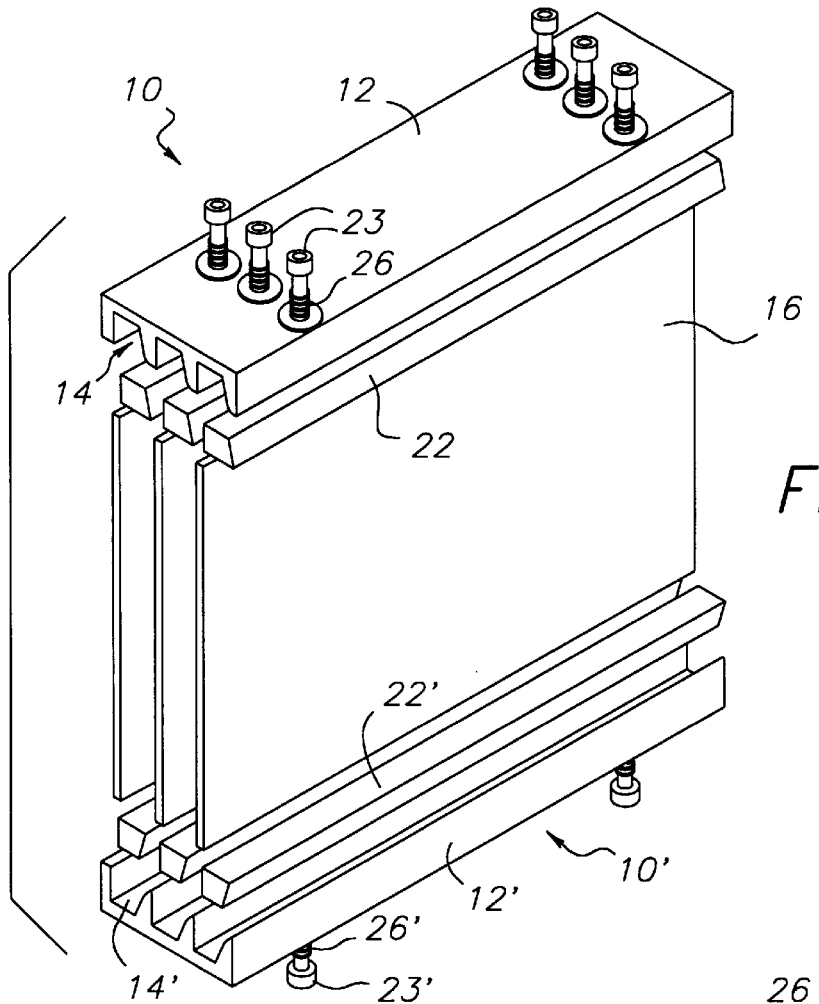
FIGS. 2 and 3 are respectively exploded, perspective and side, elevational views of the present invention.
Figure 3:
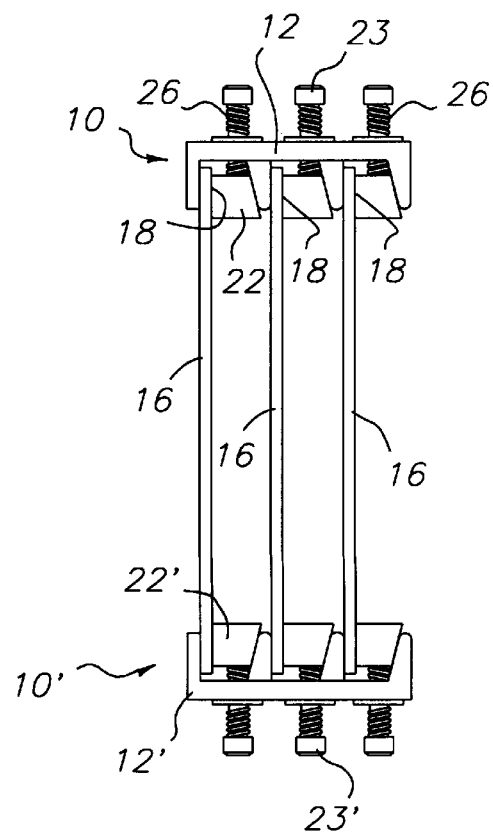

Referring now to FIGS. 1–3, there is shown an embodiment of the present invention. As shown, clamping device 10 includes a mounting member 12 having slots 14 for mounting one or more flat plates 16 (PCBs) in spaced, parallel relationship. Slots 14 include flat reference surfaces 18 machined in member 12 in controlled parallel relationship. Slots 14 also include (preferably at least partially curved) camming surfaces 20. Clamps 22 are mounted in slots 14 by screws 23 having heads 24. Tensioning springs 26 are provided between screw heads 24 and washers 25 contacting member 12. Springs 26 provide a known constant pressure on clamp 22. Shock or vibration to device 10 resulting in movement of plates 16 translates into a tightening action of clamps 22 on plates 16.

Clamps 22 have flat surfaces 28 which are parallel to but spaced from flat surfaces 18 of slots 14 to hold plate 16 to member 12. Camming surfaces 30 of clamps 22 contact camming surfaces 20 of slots 14. Off-center springs 32 are located between clamps 22 and member 12. When a plate 16 is being inserted into its slot 14 between surfaces 18 and 28, clamps 22 are first opened and spring 32 pushes clamp 22 along cam surface 20 of slot 14. This allows clamp 22 not only to relieve pressure on plate 16, but also lets clamp 22 pivot, thus allowing easier installation and removal of plate 16.

As shown in FIGS. 2 and 3, plates 16 are inserted in a second clamping device 10' spaced from clamping device 10. Device 10' is similar in construction to device 10 and includes mounting member 12' having slots 14', clamps 22', screws 23' and springs 26'.

Members 12,12' and clamps 22,22' are of thermally conductive material (metal) to facilitate passage of heat from plates 16 to member 12. Thus, heat generated by electronic circuits on PCBs can be carried away resulting in cooling of the circuits.

The invention has been described in detail with particular reference to certain preferred embodiments thereof, but it will be understood that variations and modifications can be effected within the spirit and scope of the invention.

PARTS LIST 10,10' clamping device
12,12' metallic mounting member
14,14' slots
16 flat plates
18 flat reference surfaces
20 cam surface
22,22' clamps
23,23' screws 24 heads
26,26' tensioning springs
28 flat surfaces
30 camming surfaces
32 off-center springs

What is claimed is:

1. A clamping device comprising:

a mounting member having at least one slot, said slot having a flat reference surface and an opposed camming surface spaced therefrom;

a clamp located in said at least one slot, said clamp having a flat surface parallel to but spaced from said flat surface of said slot for receiving an edge of a flat plate and having a camming surface which contacts said camming surface of said slot;

an off-center spring located between said clamp and said member; and a tensioned screw for mounting said clamp to said mounting member wherein said spring exerts a biasing force in a direction generally parallel to the axis of said tensioned screw and is offset relative to said screw axis.

2. The clamping device of claim 1 wherein said camming surface of said at least one slot is at least partially curved.

3. The clamping device of claim 1 wherein said clamp and said mounting member are of thermally conductive material to provide a thermal path from a mounted flat plate through said clamp and said mounting member.

* * * * *